(12) United States Patent
Horii et al.

(10) Patent No.: US 9,177,856 B2
(45) Date of Patent: Nov. 3, 2015

(54) SEMICONDUCTOR DEVICE AND METHOD FOR MANUFACTURING SAME

(71) Applicants: Sumitomo Electric Industries, Ltd., Osaka-shi (JP); Renesas Electronics Corporation, Kawasaki-shi (JP)

(72) Inventors: Taku Horii, Osaka (JP); Shinji Kimura, Kawasaki (JP); Mitsuo Kimoto, Itami (JP)

(73) Assignees: Sumitomo Electric Industries, Ltd., Osaka-shi (JP); Renesas Electronics Corporation, Kawasaki-shi (JP)

( * ) Notice: Subject to any disclaimer, the term of this patent is extended or adjusted under 35 U.S.C. 154(b) by 149 days.

(21) Appl. No.: 13/856,950

(22) Filed: Apr. 4, 2013

(65) Prior Publication Data

US 2013/0292703 A1    Nov. 7, 2013

Related U.S. Application Data

(60) Provisional application No. 61/643,710, filed on May 7, 2012.

(30) Foreign Application Priority Data

May 7, 2012    (JP) ................. 2012-106022

(51) Int. Cl.
*H01L 31/0312*    (2006.01)
*H01L 21/768*    (2006.01)
(Continued)

(52) U.S. Cl.
CPC ........ *H01L 21/76841* (2013.01); *H01L 21/046* (2013.01); *H01L 21/049* (2013.01);
(Continued)

(58) Field of Classification Search
CPC ................... H01L 29/78; H01L 29/1608
USPC ................. 257/77, 341–342; 438/586
See application file for complete search history.

(56) References Cited

U.S. PATENT DOCUMENTS 6,833,562 B2    12/2004    Tanimoto et al.
2004/0121616 A1    6/2004    Satta et al.
(Continued)

FOREIGN PATENT DOCUMENTS

JP    07-202185 A    8/1995
JP    2000-012846 A    1/2000
(Continued)

OTHER PUBLICATIONS

International Search Report and Written Opinion in International Application No. PCT/JP2013/059491 dated Jul. 2, 2013.
(Continued)

*Primary Examiner* — Theresa T Doan
(74) *Attorney, Agent, or Firm* — Venable LLP; Michael A. Sartori; Tamatane J. Aga (57) ABSTRACT

A MOSFET includes: a substrate; a gate insulating film; a gate electrode; an interlayer insulating film formed on the gate insulating film to surround the gate electrode; a buffer film containing Ti and N and containing no Al; and a source electrode containing Ti, Al, and Si. In the MOSFET, a contact hole is formed away from the gate electrode so as to extend through the interlayer insulating film and expose a main surface of the substrate. The buffer film is formed in contact with a side wall surface of the contact hole. The source electrode is formed on and in contact with the buffer film and the main surface of the substrate exposed by forming the contact hole.

3 Claims, 7 Drawing Sheets

(51) Int. Cl.
*H01L 29/78* (2006.01)
*H01L 21/28* (2006.01)
*H01L 21/04* (2006.01)
*H01L 29/66* (2006.01)
*H01L 29/16* (2006.01)

(52) U.S. Cl.
CPC .... *H01L21/28026* (2013.01); *H01L 21/76844* (2013.01); *H01L 21/76855* (2013.01); *H01L 29/1608* (2013.01); *H01L 29/66068* (2013.01); *H01L 29/78* (2013.01); *H01L 29/7827* (2013.01)

(56) References Cited

U.S. PATENT DOCUMENTS

| | | |
|---|---|---|
| 2005/0087788 A1 | 4/2005 | Kutsunai et al. |
| 2006/0124983 A1 | 6/2006 | Kutsunai et al. |
| 2007/0228452 A1 | 10/2007 | Asami |
| 2011/0186862 A1 | 8/2011 | Harada et al. |
| 2012/0007104 A1* | 1/2012 | Wada et al. ............ 257/77 |
| 2012/0037922 A1* | 2/2012 | Kono et al. ............ 257/77 |
| 2013/0292702 A1* | 11/2013 | Horii ..................... 257/77 |

FOREIGN PATENT DOCUMENTS

| | | |
|---|---|---|
| JP | 2005-150688 A | 6/2005 |
| JP | 2010-272766 A | 12/2010 |

OTHER PUBLICATIONS

U.S. Appl. No. 13/856,912, Taku Horii, "Semiconductor Device and Method for Manufacturing Same," filed Apr. 4, 2013.
Office Action in U.S. Appl. No. 13/856,912, dated May 21, 2014.

* cited by examiner

SEMICONDUCTOR DEVICE AND METHOD FOR MANUFACTURING SAME

BACKGROUND OF THE INVENTION

1. Field of the Invention

The present invention relates to a semiconductor device and a method for manufacturing the semiconductor device, more particularly, a semiconductor device achieving a stable characteristic by improving adhesion between an electrode containing aluminum and an interlayer insulating film, as well as a method for manufacturing such a semiconductor device.

2. Description of the Background Art

An electrode containing aluminum (Al) may be employed for a source electrode of a MOSFET (Metal Oxide Semiconductor Field Effect Transistor) or an emitter electrode of an IGBT (Insulated Gate Bipolar Transistor). For example, in the MOSFET, a positional relation or the like between such a source electrode containing Al and each of a gate electrode, a gate insulating film, and an interlayer insulating film has been considered (for example, see U.S. Pat. No. 6,833,562 and Japanese Patent Laying-Open No. 2000-012846).

In the MOSFET, the source electrode may be formed on and in contact with a surface of a substrate having an active region formed therein, and in contact with a side wall surface of an interlayer insulating film formed to surround the gate electrode on the surface. Here, if adhesion between the source electrode and the interlayer insulating film is insufficient, the source electrode comes off, thus affecting a device characteristic of the MOSFET.

SUMMARY OF THE INVENTION

The present invention has been made in view of the foregoing problem, and has its object to provide a semiconductor device achieving a stable characteristic by improving adhesion between an electrode containing aluminum and an interlayer insulating film, as well as a method for manufacturing such a semiconductor device.

A semiconductor device according to the present invention includes: a substrate made of silicon carbide; a gate insulating film formed on a surface of the substrate; a gate electrode formed on the gate insulating film; an interlayer insulating film formed on the gate insulating film to surround the gate electrode; a buffer film containing Ti and N and containing no Al; and a source electrode containing Ti, Al, and Si. In the semiconductor device, a contact hole is formed away from the gate electrode so as to extend through the interlayer insulating film and expose the surface of the substrate. The buffer film is formed on and in contact with a side wall surface of the contact hole. The source electrode is formed on and in contact with the buffer film and the surface of the substrate exposed by forming the contact hole.

Here, the expression "buffer film containing no Al" is intended to indicate a buffer film containing substantially no Al. Specifically, the buffer film is intended to indicate a buffer film in which Al is not added intentionally, and include a buffer film in which Al is contained as an impurity, for example.

In the semiconductor device according to the present invention, the source electrode is formed on and in contact with the buffer film formed in contact with the side wall surface of the contact hole extending through the interlayer insulating film, thereby improving adhesion between the source electrode and the interlayer insulating film. Hence, according to the semiconductor device in the present invention, there can be provided a semiconductor device achieving a stable characteristic by improving adhesion between the source electrode, which is an electrode containing aluminum, and the interlayer insulating film.

In the semiconductor device, the buffer film may be made of TiN. In this way, the adhesion between the source electrode and the interlayer insulating film can be more improved.

In the semiconductor device, the buffer film may have a thickness of not less than 0.025 µm and not more than 0.15 µm. Thus, the thickness of the buffer film can be set to fall within a range necessary to improve adhesion between the source electrode and the interlayer insulating film.

A method for manufacturing a semiconductor device in the present invention includes the steps of: preparing a substrate made of silicon carbide; forming a gate insulating film on a surface of the substrate; forming a gate electrode on the gate insulating film; forming an interlayer insulating film on the gate insulating film to surround the gate electrode; forming a contact hole away from the gate electrode so as to extend through the interlayer insulating film and expose the surface of the substrate; forming a buffer film, which contains Ti and N and contains no Al, on and in contact with a side wall surface of the contact hole; and forming a source electrode, which contains Ti, Al, and Si, on and in contact with the buffer film and the surface of the substrate exposed by forming the contact hole.

In the method for manufacturing the semiconductor device in the present invention, the buffer film containing Ti and N is formed on and in contact with the side wall surface of the contact hole extending through the interlayer insulating film, and thereafter the source electrode containing Ti, Al, and Si is formed on and in contact with the buffer film. Thus, in the method for manufacturing the semiconductor device in the present invention, adhesion between the source electrode and the interlayer insulating film can be improved by forming the buffer film, which contains Ti and N, in advance before forming the source electrode. Hence, according to the method for manufacturing the semiconductor device in the present invention, there can be provided a method for manufacturing a semiconductor device, by which the semiconductor device according to the present invention having a stable characteristic can be manufactured by improving adhesion between the source electrode, which is an electrode containing aluminum, and the interlayer insulating film.

In the method for manufacturing the semiconductor device, the step of forming the source electrode may include the steps of: forming a metal film in which a first metal layer, a second metal layer, and a third metal layer are stacked on one another, the first metal layer containing Ti, the second metal layer being formed on and in contact with the first metal layer and containing Al, the third metal layer being formed on and in contact with the second metal layer and containing Si; and forming the source electrode by heating the metal film. Alternatively, in the method for manufacturing the semiconductor device, the step of forming the source electrode may include the steps of: forming a metal film in which Ti, Al, and Si are mixed; and forming the source electrode by heating the metal film. In this way, the source electrode can be formed readily.

In the method for manufacturing the semiconductor device, the buffer film formed in the step of forming the buffer film may be made of TiN. In this way, the adhesion between the source electrode and the interlayer insulating film can be more improved.

In the method for manufacturing the semiconductor device, the buffer film formed in the step of forming the buffer film may have a thickness of not less than 0.025 µm and not more than 0.15 μm. Thus, the thickness of the buffer film can be set to fall within a range necessary to improve adhesion between the source electrode and the interlayer insulating film.

As apparent from the description above, according to the semiconductor device and the method for manufacturing the semiconductor device in the present invention, there can be provided a semiconductor device achieving a stable characteristic by improving adhesion between an electrode containing aluminum and an interlayer insulating film, as well as a method for manufacturing the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following describes an embodiment of the present invention with reference to figures. It should be noted that in the below-mentioned figures, the same or corresponding portions are given the same reference characters and are not described repeatedly.

Figure 1:
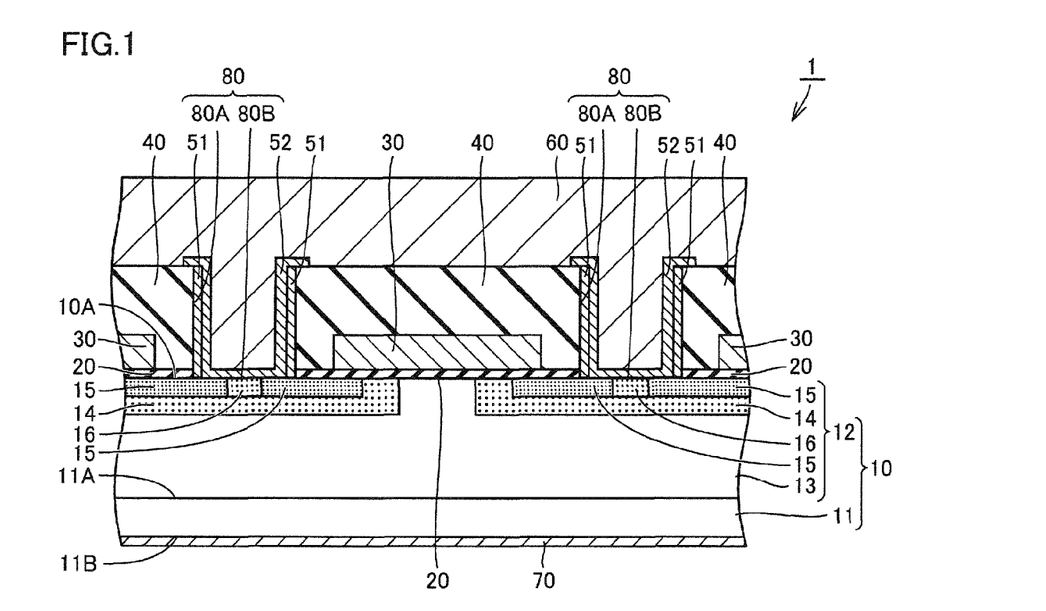
FIG. 1 is a schematic cross sectional view showing a structure of a MOSFET.

First, the following describes a structure of a MOSFET 1 serving as a semiconductor device according to the present embodiment. Referring to FIG. 1, MOSFET 1 includes a substrate 10 made of silicon carbide, gate insulating films 20, gate electrodes 30, interlayer insulating films 40, buffer layers 51, source electrodes 52, a source wire 60, and a drain electrode 70. Substrate 10 includes a base substrate 11 and a semiconductor layer 12. In semiconductor layer 12, a drift region 13, body regions 14, source regions 15, and contact regions 16 are formed. Further, in MOSFET 1, contact holes 80 are formed away from gate electrode 30 so as to extend through gate insulating film 20 and interlayer insulating film 40 and expose a main surface 10A of substrate 10.

Base substrate 11 contains an n type impurity such as N (nitrogen) and therefore has n type conductivity (first conductivity type). Drift region 13 is an epitaxial growth layer formed on a main surface 11A of base substrate 11. As with base substrate 11, drift region 13 contains an n type impurity such as N (nitrogen), and therefore has n type conductivity. The concentration thereof in drift region 13 is lower than that in base substrate 11.

Body regions 14 include main surface 10A of substrate 10, and are formed to be separated from each other in semiconductor layer 12. Each of body regions 14 contains a p type impurity such as Al (aluminum) or B (boron), and therefore has p type conductivity (second conductivity type).

Source regions 15 include main surface 10A, and are formed in body regions 14 such that they are surrounded by body regions 14. Each of source regions 15 contains an n type impurity such as P (phosphorus), and therefore has n type conductivity as with base substrate 11 and drift region 13. Further, the concentration of the n type impurity in source region 15 is higher than the concentration of the n type impurity in drift region 13.

As with source region 15, contact regions 16 include main surface 10A, are surrounded by body regions 14, and are respectively formed in body regions 14 so as to be adjacent to source regions 15. As with body region 14, each of contact regions 16 contains a p type impurity such as Al (aluminum) or B (boron) and therefore has p type conductivity. The concentration thereof in contact region 16 is higher than that in body region 14.

Each of gate insulating films 20 is made of, for example, $SiO_2$ (silicon dioxide), and is formed to be disposed on and in contact with main surface 10A and extend from the upper surface of one source region 15 to the upper surface of the other source region 15.

Each of gate electrodes 30 is disposed on and in contact with gate insulating film 20, and is formed to extend from a portion above one source region 15 to a portion above the other source region 15. Gate electrode 30 is made of a conductor such as polysilicon having an impurity added therein, for example.

Interlayer insulating film 40 is made of, for example, $SiO_2$ (silicon dioxide), and is formed on gate insulating film 20 to surround gate electrode 30. Each of contact holes 80 has side wall surfaces 80A and a bottom surface 80B, and is formed to extend through interlayer insulating film 40 and gate insulating film 20. Further, as shown in FIG. 1, each of side wall surfaces 80A of contact hole 80 is constituted of interlayer insulating film 40 and gate insulating film 20, and bottom surface 80B thereof corresponds to the upper surfaces of source region 15 and contact region 16.

In contact hole 80, buffer film 51 is formed on and in contact with side wall surface 80A. Buffer film 51 is a film containing Ti and N and containing no Al. For example, buffer film 51 may be a film made of TiN. Alternatively, buffer film 51 may be a film made of TiW or a film made of TaN.

Source electrode 52 is formed on and in contact with buffer film 51 and main surface 10A of substrate 10 exposed by forming contact hole 80. Further, source electrode 52 is a film containing Ti, Al, and Si, for example, is made of a TiAlSi alloy.

Drain electrode 70 is formed on a main surface 11B of base substrate 11 opposite to main surface 11A thereof. As with source electrode 52, drain electrode 70 is made of, for example, a TiAlSi alloy, and is electrically connected to base substrate 11.

Source wire 60 is formed to cover source electrode 52 and interlayer insulating film 40. Source wire 60 is made of a metal such as Al (aluminum), and is electrically connected to source region 15 via source electrode 52.

The following describes an operation of MOSFET 1 serving as the semiconductor device according to the present embodiment. Referring to FIG. 1, when a voltage is applied between source electrode 52 and drain electrode 70 while an applied voltage to gate electrode 30 is lower than a threshold voltage, i.e., while it is in OFF state, a pn junction formed between body region 14 and drift region 13 is reverse-biased. Accordingly, MOSFET 1 is in the non-conductive state. Meanwhile, when gate electrode 30 is fed with a voltage equal to or higher than the threshold voltage, an inversion layer is formed in body region 14. As a result, source region 15 and drift region 13 are electrically connected to each other, whereby a current flows between source electrode 52 and drain electrode 70. In the manner described above, MOSFET 1 operates.

As described above, in MOSFET 1 according to the present embodiment, source electrode 52 is formed on and in contact with buffer film 51 formed in contact with side wall surface 80A of contact hole 80 extending through interlayer insulating film 40, thereby improving adhesion between source electrode 52 and interlayer insulating film 40. Thus, MOSFET 1 according to the present embodiment is a semiconductor device achieving stable characteristic by improving adhesion between source electrode 52, which is an electrode containing aluminum, and interlayer insulating film 40.

Further, in MOSFET 1, buffer film 51 may be made of TiN as described above. In this way, the adhesion between source electrode 52 and interlayer insulating film 40 can be more improved.

Further, in MOSFET 1, buffer film 51 may have a thickness of not less than 0.025 μm and not more than 0.15 μm. Thus, the thickness of buffer film 51 can be set to fall within a range necessary to improve adhesion between source electrode 52 and interlayer insulating film 40.

Figure 2:
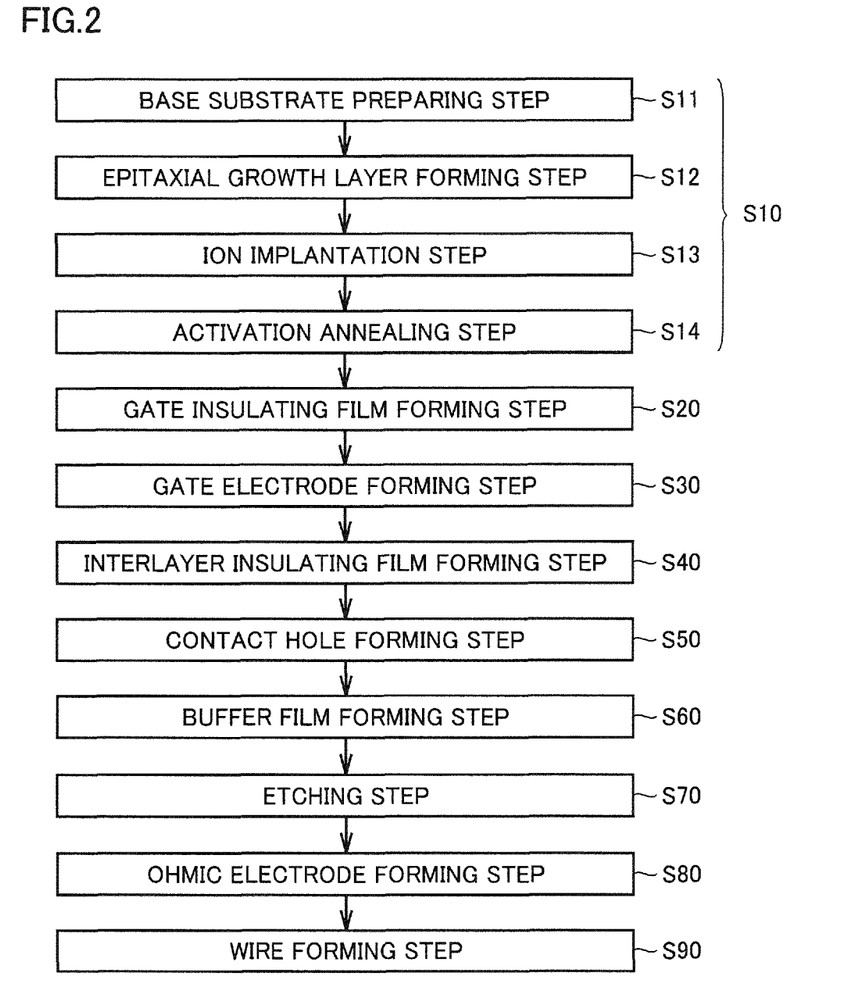
FIG. 2 is a flowchart schematically showing a method for manufacturing the MOSFET.
Figure 3:
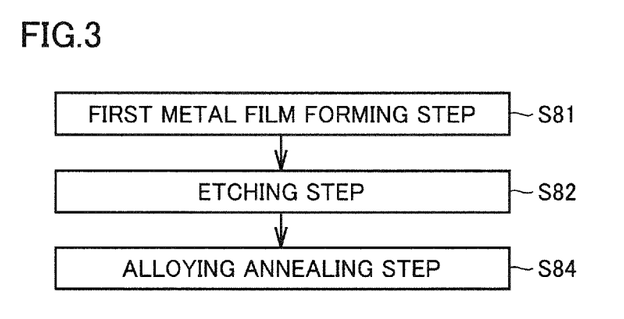
FIG. 3 is a flowchart schematically showing a step of forming a source electrode.
Figure 4:
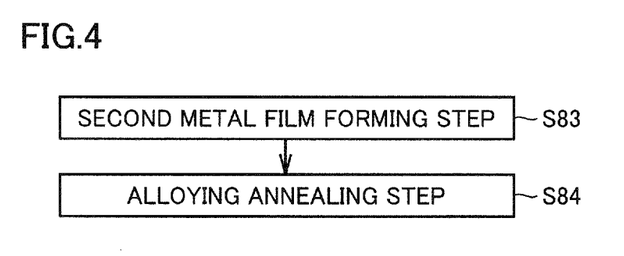
FIG. 4 is a flowchart schematically showing a step of forming a drain electrode.
Figure 5:
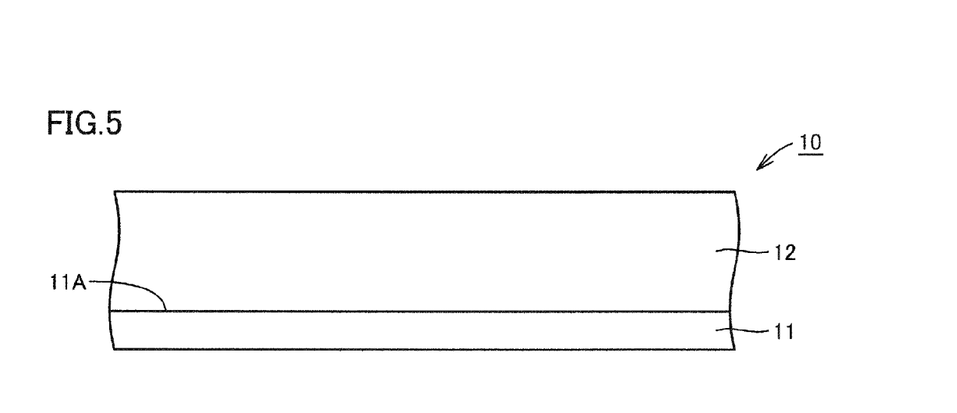
FIG. 5 is a schematic cross sectional view for illustrating the method for manufacturing the MOSFET.
Figure 6:
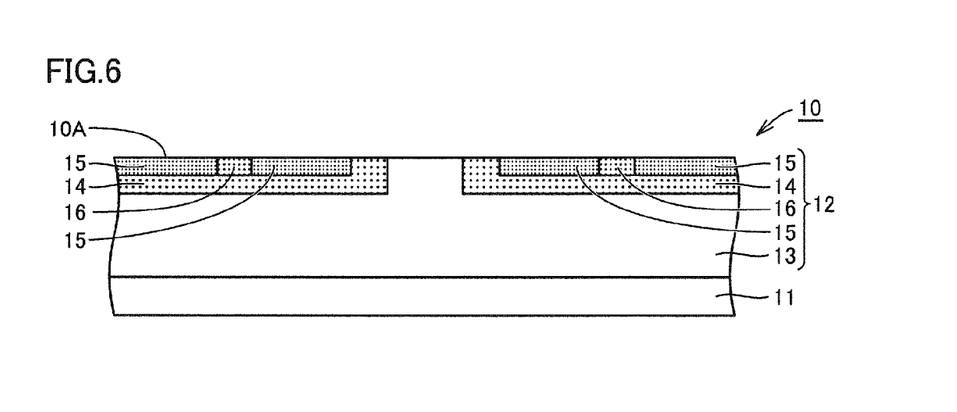
FIG. 6 is a schematic cross sectional view for illustrating the method for manufacturing the MOSFET.
Figure 7:
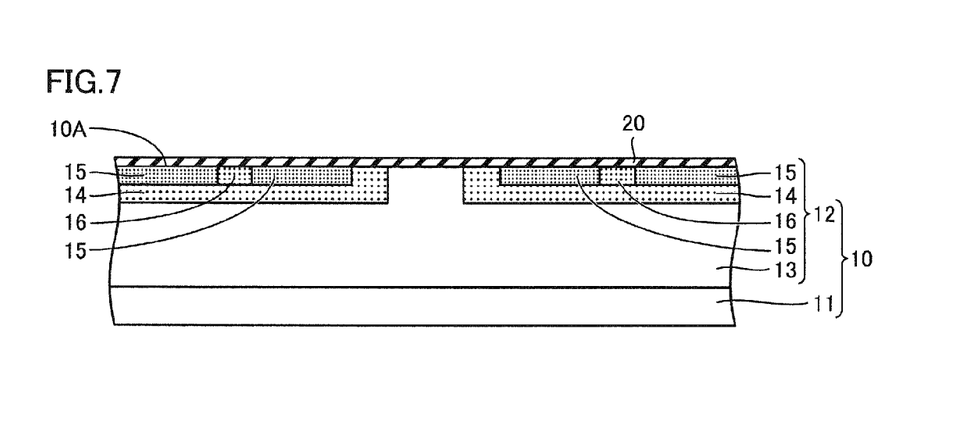
FIG. 7 is a schematic cross sectional view for illustrating the method for manufacturing the MOSFET.
Figure 8:
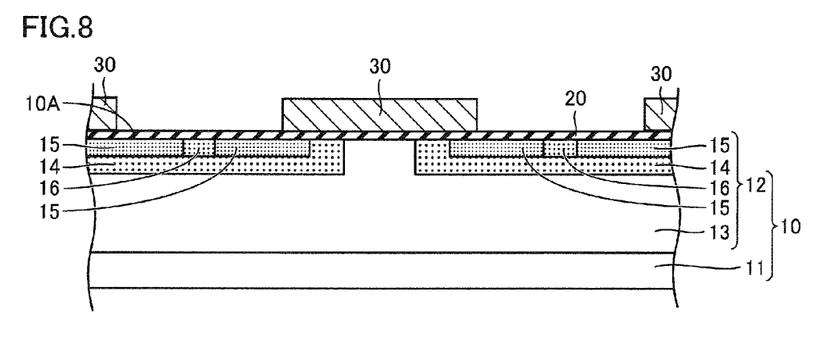
FIG. 8 is a schematic cross sectional view for illustrating the method for manufacturing the MOSFET.
Figure 9:
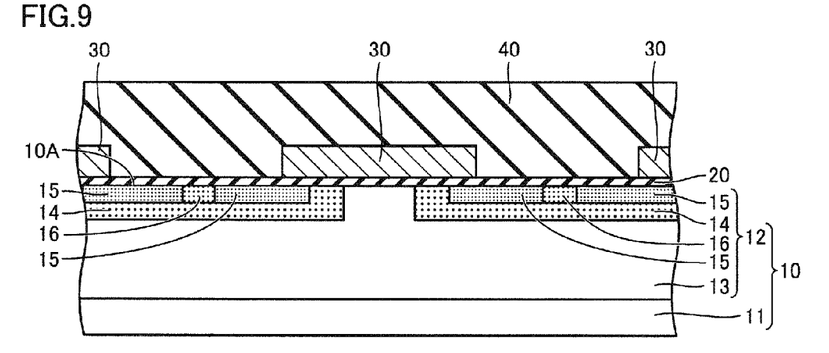
FIG. 9 is a schematic cross sectional view for illustrating the method for manufacturing the MOSFET.

The following describes a method for manufacturing the semiconductor device in one embodiment of the present invention with reference to FIG. 1 to FIG. 15. In the method for manufacturing the semiconductor device in the present embodiment, MOSFET 1 serving as the semiconductor device according to the present embodiment is manufactured. Referring to FIG. 2, a substrate preparing step (S10) is first performed. In this step (S10), steps (S11) to (S14) described below are performed to prepare substrate 10 made of silicon carbide.

First, as step (S11), a base substrate preparing step is performed. In this step (S11), referring to FIG. 5, an ingot (not shown) made of, for example, 4H-SiC is sliced to prepare base substrate 11 having n type conductivity.

Next, as a step (S12), an epitaxial growth layer forming step is performed. In this step (S12), referring to FIG. 5, semiconductor layer 12 having n type conductivity is formed by epitaxial growth on main surface 11A of base substrate 11.

Next, as step (S13), an ion implantation step is performed. In this step (S13), referring to FIG. 6, for example, Al ions are first implanted into regions including main surface 10A of substrate 10, thereby forming body regions 14 of p type conductivity in semiconductor layer 12. Next, for example, P ions are implanted into each of body regions 14 at a depth shallower than the depth in which the Al ions have been implanted, thereby forming source region 15 of n type conductivity. Then, for example, Al ions are further implanted into body region 14, thereby forming contact region 16 adjacent to source region 15, having the same depth as that of source region 15, and having p type conductivity. Further, in semiconductor layer 12, a region in which none of body region 14, source region 15, and contact region 16 is formed serves as drift region 13.

Next, as step (S14), an activation annealing step is performed. In this step (S14), by heating substrate 10, the impurities implanted in step (S13) are activated. Accordingly, desired carriers are generated in the regions having the impurities implanted therein. In this way, by performing steps (S11) to (S14), substrate 10 is prepared in which an active region is formed by the implantation of the impurities.

Next, as a step (S20), a gate insulating film forming step is performed. In this step (S20), referring to FIG. 7, for example, by heating substrate 10 in an atmosphere containing oxygen, gate insulating film 20 made of $SiO_2$ (silicon dioxide) is formed to cover main surface 10A of substrate 10.

Next, as a step (S30), a gate electrode forming step is performed. In this step (S30), referring to FIG. 8, for example, an LPCVD (Low Pressure Chemical Vapor Deposition) method is employed to form, on gate insulating film 20, gate electrode 30 made of polysilicon containing an impurity.

Next, as a step (S40), an interlayer insulating film forming step is performed. In this step (S40), referring to FIG. 9, for example, a P (Plasma)-CVD method is employed to form interlayer insulating film 40 made of $SiO_2$ (silicon dioxide) on gate insulating film 20 such that interlayer insulating film 40 and gate insulating film 20 surround gate electrode 30.

Figure 10:
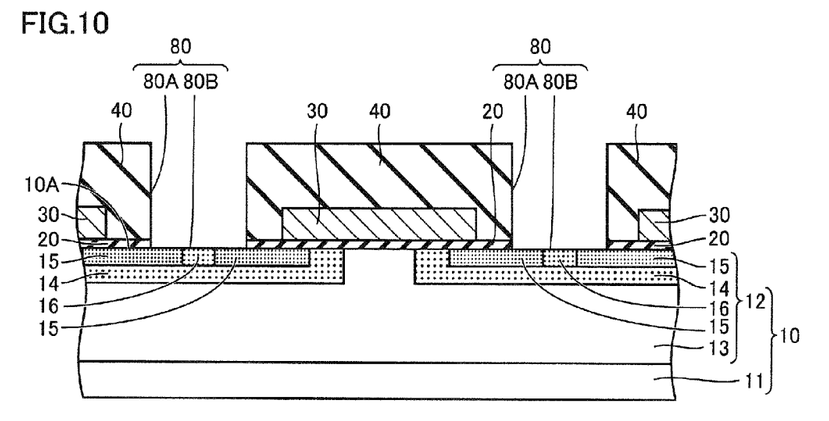
FIG. 10 is a schematic cross sectional view for illustrating the method for manufacturing the MOSFET.
Figure 11:
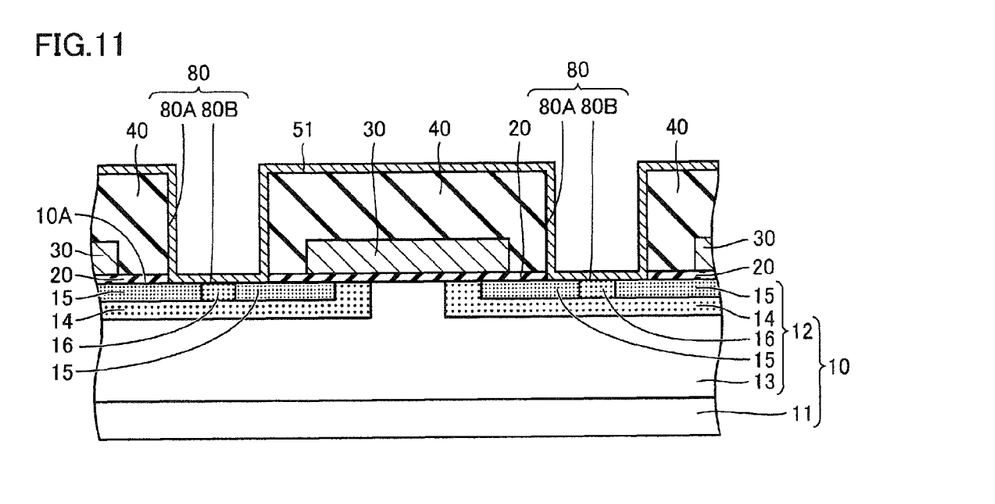
FIG. 11 is a schematic cross sectional view for illustrating the method for manufacturing the MOSFET.
Figure 12:
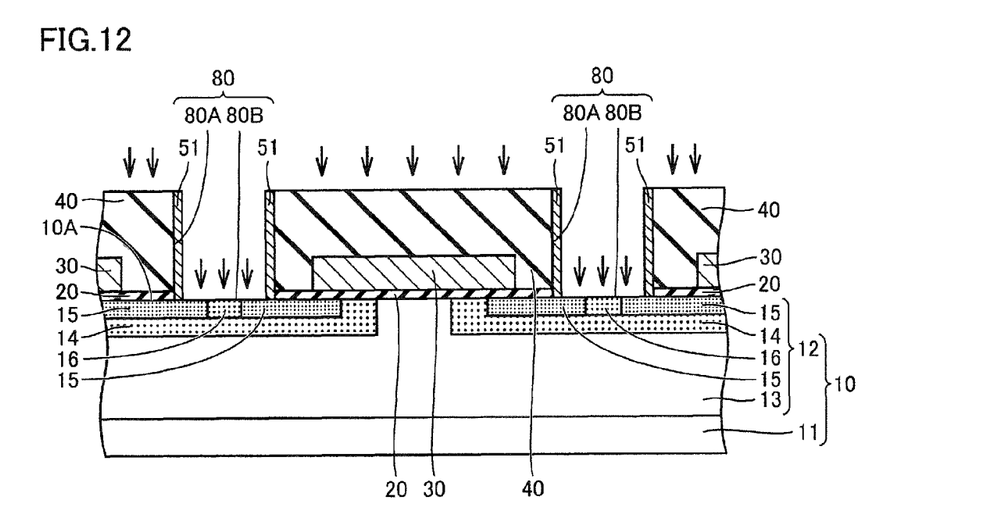
FIG. 12 is a schematic cross sectional view for illustrating the method for manufacturing the MOSFET.
Figure 13:
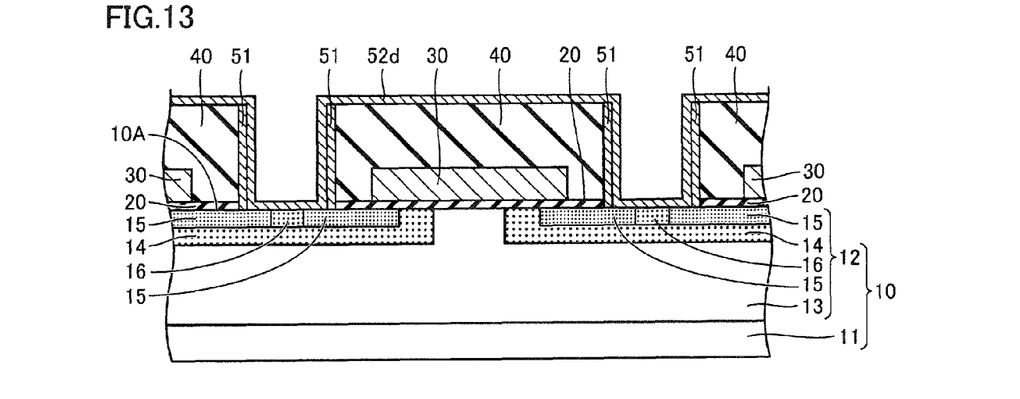
FIG. 13 is a schematic cross sectional view for illustrating the method for manufacturing the MOSFET.
Figure 14:
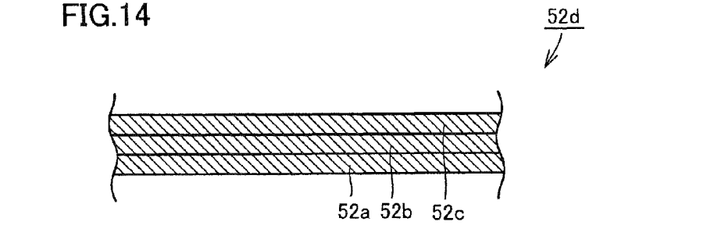
FIG. 14 is an enlarged view schematically showing a structure of a first metal film in FIG. 13.
Figure 15:
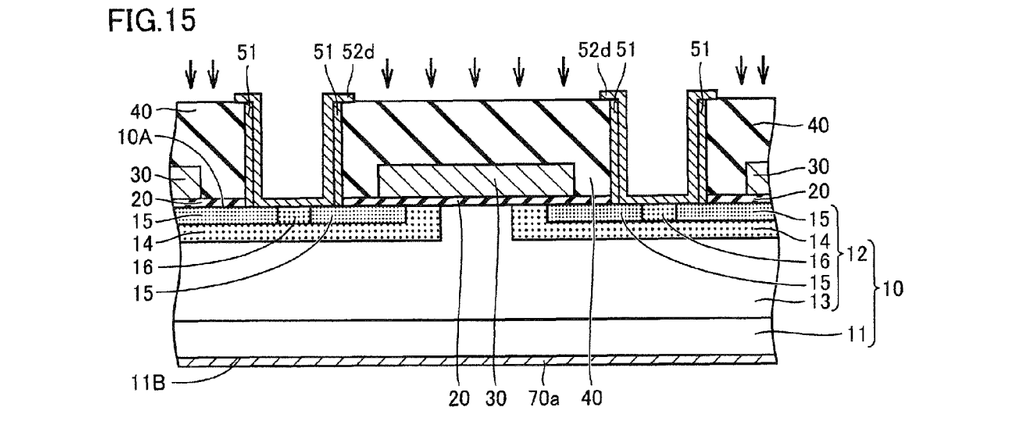
FIG. 15 is a schematic cross sectional view for illustrating the method for manufacturing the MOSFET.

Next, as a step (S50), a contact hole forming step is performed. In this step (S50), referring to FIG. 10, contact hole 80 is formed to have side wall surface 80A and bottom surface 80B and expose main surface 10A of substrate 10. Specifically, for example, an etching method such as RIE (Reactive Ion Etching) is employed to etch through interlayer insulating film 40 and gate insulating film 20, thereby forming contact hole 80 exposing main surface 10A of substrate 10 (the upper surfaces of source region 15 and contact region 16). Further, in this step (S50), contact hole 80 is formed away from gate electrode 30. Hence, as shown in FIG. 10, gate electrode 30 is maintained to be surrounded by gate insulating film 20 and interlayer insulating film 40.

Next, as a step (S60), a buffer film forming step is performed. In this step (S60), referring to FIG. 11, for example, sputtering is performed to form buffer film 51 on and in contact with side wall surface 80A and bottom surface 80B of contact hole 80 and the upper surface of interlayer insulating film 40. In this step (S60), for example, a film made of TiN may be formed as buffer film 51 containing Ti and N and containing no Al. Alternatively, as buffer film 51, a film made of TiW or a film made of TaN may be formed. Further, in this step (S60), buffer film 51 may be formed to have a thickness of not less than 0.025 μm and not more than 0.15 μm.

Next, as a step (S70), an etching step is performed. In this step (S70), as indicated by arrows in FIG. 12, dry etching is performed from the side of main surface 10A of substrate 10, thereby removing buffer film 51 from the upper surface of interlayer insulating film 40 and bottom surface 80B of contact hole 80 while buffer film 51 remains on side wall surface 80A of contact hole 80.

Next, as step (S80), an ohmic electrode forming step is performed. In this step (S80), referring to FIG. 3 and FIG. 4, steps (S81) to (S84) described below are performed to form source electrode 52, which contains Ti, Al, and Si, on and in contact with buffer layer 51 and main surface 10A of substrate 10 exposed by forming contact hole 80, and form drain electrode 70, which is made of, for example, the same material as that of source electrode 52, on and in contact with main surface 11B of base substrate 11.

First, as step (S81), a first metal film forming step is performed. In this step (S81), referring to FIG. 13 and FIG. 14, for example, sputtering is performed to form a first metal film 52d structured to include a first metal layer 52a, a second metal layer 52b, and a third metal layer 52c stacked on one another. First metal layer 52a contains Ti. Second metal layer 52b is on and in contact with first metal layer 52a and contains Al. Third metal layer 52c is on and in contact with second metal layer 52b and contains Si. Although first metal film 52d may be formed by forming first to third metal layers 52a to 52c on one another in this step (S81) as described above, the present invention is not limited to this. For example, a first metal film 52d in which Ti, Al, and Si are mixed may be formed by simultaneously sputtering Ti, Al, and Si.

Next, as step (S82), an etching step is performed. In this step (S82), a mask (not shown) is disposed in the vicinity of contact hole 80, and then dry etching is performed from the side of main surface 10A of substrate 10 as indicated by arrows in FIG. 15, thereby mainly removing first metal film 52d from the upper surface of interlayer insulating film 40. As a result, first metal film 52d on and in contact with buffer film 51 and bottom surface 80B of contact hole 80 remains.

Next, as step (S83), a second metal film forming step is performed. In this step (S83), referring to FIG. 15, as with first metal film 52d, a second metal film 70a in which layers of Ti, Al, and Si are stacked on one another or in which Ti, Al, and Si are mixed is formed by means of sputtering on main surface 11B of base substrate 11, for example.

Next, as step (S84), an alloying annealing step is performed. In this step (S84), referring to FIG. 1, first and second metal films 52d, 70a formed in steps (S81) and (S83) are heated. Accordingly, Ti, Al, and Si, which composes first and second metal films 52d, 70a, are alloyed, thereby forming source electrode 52 and drain electrode 70 each made of the TiAlSi alloy and making ohmic contact with substrate 10. In step (S80), by thus performing steps (S81), (S82) and (S84), source electrode 52 is formed (see FIG. 3). By performing steps (S83) and (S84), drain electrode 70 is performed (see FIG. 4).

Next, as a step (S90), a wire forming step is performed. In this step (S90), referring to FIG. 1, for example, a deposition method is employed to form source wire 60, which is made of a conductor such as Al, on and in contact with source electrode 50. By performing steps (S10) to (S90), MOSFET 1 is manufactured, thus completing the method for manufacturing the semiconductor device in the present embodiment.

As described above, in the method for manufacturing the semiconductor device in the present embodiment, buffer film 51 containing Ti and N is formed on and in contact with side wall surface 80A of contact hole 80 extending through interlayer insulating film 40, and thereafter source electrode 52 containing Ti, Al, and Si is formed on and in contact with buffer film 51. Thus, in the method for manufacturing the semiconductor device in the present embodiment, adhesion between source electrode 52 and interlayer insulating film 40 can be improved by forming buffer film 51, which contains Ti and N, in advance before forming source electrode 52. Hence, according to the method for manufacturing the semiconductor device in the present embodiment, there can be manufactured MOSFET 1, which serves as a semiconductor device according to the present embodiment, achieving a stable characteristic by improving adhesion between source electrode 52, which is an electrode containing aluminum, and interlayer insulating film 40.

Further, in the present embodiment, in the case of an IGBT, an emitter electrode can be employed as an electrode having a function of supplying carriers, as with source electrode 52 described above, for example.

The semiconductor device and the method for manufacturing the semiconductor device in the present invention can be particularly advantageously applied to a semiconductor device, which is required to achieve a stable characteristic by improving adhesion between an electrode containing aluminum and an interlayer insulating film, as well as a method for manufacturing such a semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a substrate made of silicon carbide, a first region having first conductivity type and a second region having second conductivity type formed on a surface of said substrate, wherein said first region is a pair of first regions formed so as to sandwich said second region;
    a gate insulating film formed on said surface of said substrate;
    a gate electrode formed on said gate insulating film;
    an interlayer insulating film formed on said gate insulating film to surround said gate electrode;
    a buffer film containing Ti and N and containing no Al; and
    a source electrode containing Ti, Al, and Si,
    a contact hole being formed away from said gate electrode so as to extend through said interlayer insulating film and expose said surface of said substrate,
    said buffer film being formed on and in contact with a side wall surface of said contact hole,
    said source electrode being formed on and in contact with said buffer film and said surface of said substrate exposed by forming said contact hole, and
    said source electrode being formed in contact with both of said first region and said second region on said surface of said substrate,
    said buffer film, which is formed on and in contact with a side wall surface of said contact hole, is terminated at an end of said first region, said end of said first region being located at a near side to said gate insulating film in the thickness direction of said first region, and
    said source electrode covers an end of said buffer film, said end of said buffer film being located at a side apart from said first region, and said source electrode extends to an outer position with respect to said side wall surface of said contact hole.

2. The semiconductor device according to claim 1, wherein said buffer film is made of TiN.

3. The semiconductor device according to claim 1, wherein said buffer film has a thickness of not less than 0.025 μm and not more than 0.15 μm.

* * * * *